(12) United States Patent
Hirata et al.

(10) Patent No.: US 11,618,106 B2
(45) Date of Patent: Apr. 4, 2023

(54) PROCESSING METHOD AND LASER PROCESSING APPARATUS INCLUDING IMAGING DETECTOR FOR SIC INGOT

(71) Applicant: DISCO CORPORATION, Tokyo (JP)

(72) Inventors: Kazuya Hirata, Tokyo (JP); Shin Tabata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 441 days.

(21) Appl. No.: 17/065,696

(22) Filed: Oct. 8, 2020

(65) Prior Publication Data

US 2021/0121988 A1    Apr. 29, 2021

(30) Foreign Application Priority Data

Oct. 24, 2019  (JP) .............................. JP2019-193409

(51) Int. Cl.
*B23K 26/53*     (2014.01)
*B23K 26/0622*   (2014.01)
(Continued)

(52) U.S. Cl.
CPC .......... *B23K 26/53* (2015.10); *B23K 26/0622* (2015.10); *B23K 26/0643* (2013.01);
(Continued)

(58) Field of Classification Search
CPC ................ B23K 26/53; B23K 26/0622; B23K 26/0643; B23K 26/0853; B23K 26/38; B23K 26/60; B23K 26/705; B23K 2101/40; B23K 2103/56; B23K 26/032; B23K 26/0823; B23K 26/402; B23K 26/062; B23K 26/0648; B23K 26/08; B23K 26/0006; H01L 21/02378; H01L 21/02675; H01L 21/322; H01L 21/30; H01L 21/304; H01L 21/78; C30B 29/06; C30B 33/06; B28D 5/0011; B28D 5/0052
See application file for complete search history.

(56) References Cited

U.S. PATENT DOCUMENTS

| | | | |
|---|---|---|---|
| 10,576,585 B1 * | 3/2020 | Donofrio | ................. B28D 5/00 |
| 2017/0291255 A1 * | 10/2017 | Hirata | ..................... C30B 33/04 |
| 2018/0254223 A1 * | 9/2018 | Hirata | .................... B23K 26/53 |

FOREIGN PATENT DOCUMENTS

| | | |
|---|---|---|
| JP | 2000094221 A | 4/2000 |
| JP | 2016111143 A | 6/2016 |

* cited by examiner

*Primary Examiner* — John P. Dulka
(74) *Attorney, Agent, or Firm* — Greer Burns & Crain Ltd.

(57) ABSTRACT

A processing method for processing an SiC ingot includes a peel-off zone forming step of applying a processing pulsed laser beam having a wavelength transmittable through the ingot to the ingot while positioning a focused spot of the processing pulsed laser beam at a depth corresponding to a thickness of a wafer to be peeled off from the ingot, to form belt-shaped peel-off zones each including cracks in the ingot, a reflected beam detecting step of applying an inspecting laser beam having a wavelength transmittable through the ingot and reflectable from cracks of the peel-off zones and detecting an intensity of a beam reflected by the cracks, and a processing laser beam output power adjusting step of adjusting an output power of the processing pulsed laser beam to keep the intensity of the reflected beam detected in the reflected beam detecting step within a predetermined range.

3 Claims, 5 Drawing Sheets

(51) Int. Cl.
*B23K 26/70* (2014.01)
*B23K 26/08* (2014.01)
*B23K 26/06* (2014.01)
*B23K 26/38* (2014.01)
*B23K 26/60* (2014.01)
*H01L 21/02* (2006.01)
*B23K 103/00* (2006.01)
*B23K 101/40* (2006.01)

(52) U.S. Cl.
CPC .......... *B23K 26/0853* (2013.01); *B23K 26/38* (2013.01); *B23K 26/60* (2015.10); *B23K 26/705* (2015.10); *B23K 2101/40* (2018.08); *B23K 2103/56* (2018.08); *H01L 21/02378* (2013.01); *H01L 21/02675* (2013.01)

PROCESSING METHOD AND LASER PROCESSING APPARATUS INCLUDING IMAGING DETECTOR FOR SIC INGOT

BACKGROUND OF THE INVENTION

Field of the Invention

The present invention relates to a processing method and a laser processing apparatus for an SiC ingot.

Description of the Related Art

Devices such as integrated circuits (ICs), large scale integration (LSI) circuits, and light-emitting diodes (LEDs) are formed on a wafer made of silicon (Si), sapphire ($Al_2C_3$), or the like by layering a functional layer on the surface of the wafer and demarcating a plurality of areas on the functional layer with a grid of projected dicing lines thereon. Power devices, LEDs, or the like are formed on a wafer made of single-crystal silicon carbide (SiC) by layering a functional layer on the surface of the wafer and demarcating a plurality of areas on the functional layer with a grid of projected dicing lines thereon. The wafer with the devices formed thereon is diced along the projected dicing lines by a cutting apparatus or a laser processing apparatus, producing individual device chips. The device chips will be used in electric appliances such as mobile phones and personal computers.

Wafers on which to form devices are generally produced by slicing a cylindrical semiconductor ingot with a wire saw. The face and reverse sides of the wafers sliced from the ingot are polished to a mirror finish (see, for example, JP 2000-94221A). However, it is uneconomical to slice a semiconductor ingot into wafers with a wire saw and polish the face and reverse sides of the wafers because much of the semiconductor ingot, for example, 70% to 80% thereof, is wasted. Particularly, SiC ingots are disadvantageous in that they are of poor productivity as they are hard, difficult and time-consuming to cut with a wire saw, and their unit cost is so high that they fail to produce wafers efficiently.

The present applicant has proposed a technology in which a laser beam having a wavelength transmittable through single-crystal SiC is applied to an SiC ingot while positioning a focused spot of the laser beam within the SiC ingot, thereby forming peel-off zones in a projected severance plane in the SiC ingot, and then a wafer is peeled off from the SiC ingot along the projected severance plane where the peel-off zones are formed (see, for example, JP 2016-111143A).

SUMMARY OF THE INVENTION

As the growth of an SiC ingot progresses, its crystal structure becomes more uniform. Therefore, it is necessary to apply a laser beam to the SiC ingot with more energy when to form peel-off zones in an ingot portion grown early than when to form peel-off zones in an ingot portion grown later. Consequently, the proposed technology is problematic in that the laser beam applied to the SiC ingot is required to have different energy levels to form proper peel-off zones in the SiC ingot at different heights or axial positions in the SiC ingot.

It is therefore an object of the present invention to provide a processing method and a laser processing apparatus for an SiC ingot that are capable of forming proper peel-off zones in the SiC ingot at any heights in the SiC ingot.

In accordance with an aspect of the present invention, there is provided a method of processing an SiC ingot in which a c-plane is inclined to an end face of the SiC ingot and a direction perpendicular to a direction in which an off angle is formed between the end face of the SiC ingot and the c-plane is represented as X-axis directions and a direction perpendicular to the X-axis directions is represented as Y-axis direction, including a peel-off zone forming step of applying a processing pulsed laser beam whose wavelength is transmittable through the SiC ingot to the SiC ingot while positioning a focused spot of the processing pulsed laser beam at a depth corresponding to a thickness of a wafer to be peeled off from the SiC ingot, and processing-feeding the SiC ingot and the focused spot relatively to each other in the X-axis direction to form belt-shaped peel-off zones in the SiC ingot each including cracks extending along the c-plane from a region where SiC is separated into Si and C, an indexing feed step of indexing-feeding the SiC ingot and the focused spot relatively to each other in the Y-axis direction to array the peel-off zones in the Y-axis direction, a reflected beam detecting step of applying an inspecting laser beam having a wavelength transmittable through the SiC ingot and reflectable from the cracks of the peel-off zones and detecting an intensity of a beam reflected by the cracks, and a processing laser beam output power adjusting step of adjusting an output power of the processing pulsed laser beam to keep the intensity of the reflected beam detected in the reflected beam detecting step within a predetermined range.

Preferably, the method further includes, before the peel-off zone forming step, a flat surface forming step of grinding the end face of the SiC ingot into a flat surface.

In accordance with another aspect of the present invention, there is provided a laser processing apparatus for forming peel-off zones in an SiC ingot in which a c-plane is inclined to an end face of the SiC ingot and a direction perpendicular to a direction in which an off angle is formed between the end face of the SiC ingot and the c-plane is represented as X-axis direction and a direction perpendicular to the X-axis direction is represented as Y-axis direction, including a holding table for holding the SiC ingot thereon, a laser beam applying unit including a beam condenser for applying a processing pulsed laser beam whose wavelength is transmittable through the SiC ingot, held on the holding table, to the SiC ingot while positioning a focused spot of the processing pulsed laser beam at a depth corresponding to a thickness of a wafer to be peeled off from the SiC ingot, to form belt-shaped peel-off zones in the SiC ingot each including cracks extending along the c-plane from a region where SiC is separated into Si and C, an X-axis feed mechanism for processing-feeding the holding table and the beam condenser relatively to each other in the X-axis direction, a Y-axis feed mechanism for indexing-feeding the holding table and the beam condenser relatively to each other in the Y-axis direction, a reflected beam detecting unit for applying an inspecting laser beam having a wavelength transmittable through the SiC ingot and reflectable from the cracks of the peel-off zones and detecting an intensity of a beam reflected by the cracks, and a control unit for adjusting an output power of the processing pulsed laser beam to keep the intensity of the reflected beam detected by the reflected beam detecting unit within a predetermined range.

The method of processing an SiC ingot according to the aspect of the present invention is able to form proper peel-off zones in the SiC ingot at any heights in the SiC ingot.

The laser processing apparatus according to the other aspect of the present invention is able to form proper peel-off zones in the SiC ingot at any heights in the SiC ingot, similarly to the method of processing an SiC ingot.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A processing method and a laser processing apparatus for an SiC ingot according to a preferred embodiment of the present invention will be described below with reference to the drawings.

Figure 1:
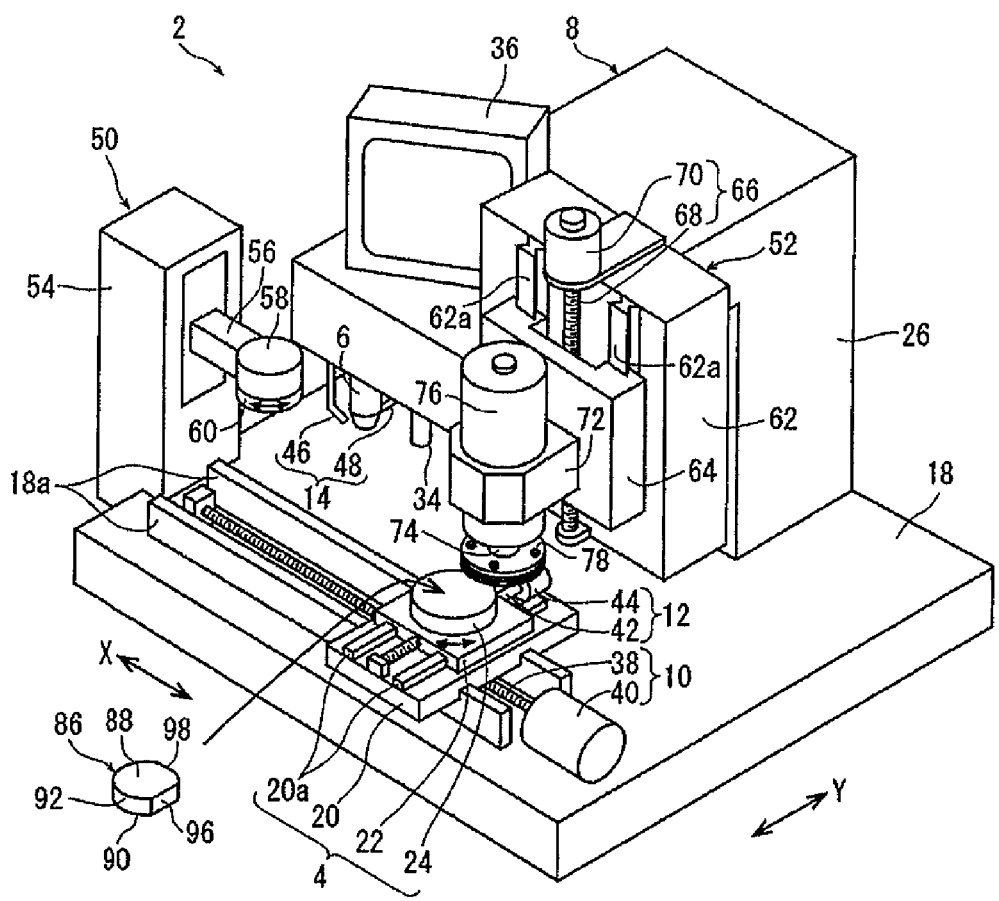
FIG. 1 is a perspective view of a laser processing apparatus according to an embodiment of the present invention.

First, the laser processing apparatus according to the present embodiment will be described below with reference to FIG. 1. As illustrated in FIG. 1, a laser processing apparatus, generally denoted by 2, includes a holding unit 4 for holding an SiC ingot 86 thereon, a laser beam applying unit 8 including a beam condenser 6 for applying a processing pulsed laser beam having a wavelength transmittable through the SiC ingot 86 to the SiC ingot 86 while positioning a focused spot of the laser beam within the SiC ingot 86 at a depth corresponding to a thickness of a wafer to be peeled off from the SiC ingot 86, thereby forming in the SiC ingot 86 belt-shaped peel-off zones each including cracks extending along a c-plane from a region where SiC is separated into silicon (Si) and carbon (C), an X-axis feed mechanism 10 for processing-feeding the holding unit 4 and the beam condenser 6 relatively to each other in X-axis directions, a Y-axis feed mechanism 12 for indexing-feeding the holding unit 4 and the beam condenser 6 relatively to each other in Y-axis directions, a reflected beam detecting unit 14 for applying an inspecting laser beam having a wavelength transmittable through the SiC ingot and reflectable from the cracks of the peel-off zones and detecting an intensity of a beam reflected by the cracks, and a control unit 16 (see FIG. 2) for controlling an output power of the processing pulsed laser beam in order for the intensity of the reflected beam detected by the reflected beam detecting unit 14 to fall within a predetermined range. The X-axis directions refer to directions represented by an arrow X illustrated in FIG. 1 and the Y-axis directions refer to directions represented by an arrow Y illustrated in FIG. 1 and are perpendicular to the X-axis directions. The X-axis directions and the Y-axis directions jointly define an XY plane that is essentially horizontal.

As illustrated in FIG. 1, the holding unit 4 includes an X-axis movable plate 20 movably mounted on a base 18 for movement in the X-axis directions, a Y-axis movable plate 22 movably mounted on the X-axis movable plate 20 for movement in the Y-axis directions, a circular holding table 24 rotatably mounted on an upper surface of the Y-axis movable plate 22, and a holding table motor, not illustrated, for rotating the holding table 24 about its central axis.

Figure 2:
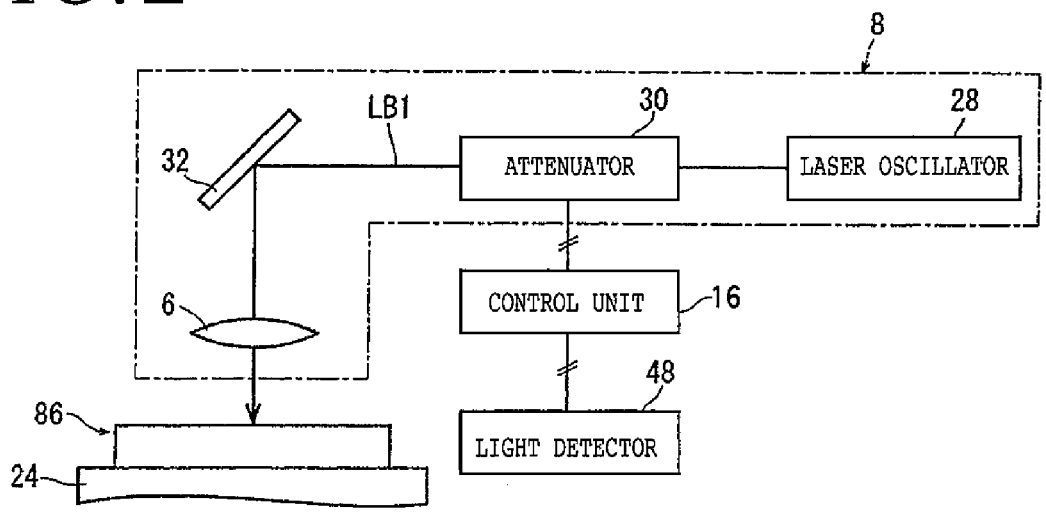
FIG. 2 is a block diagram of a portion of a configuration of the laser processing apparatus illustrated in FIG. 1.

The laser beam applying unit 8 includes a housing 26 having an upward column that extends upwardly from an upper surface of the base 18 and an arm extending essentially horizontally from the upper end of the upward column. As illustrated in FIG. 2, the housing 26 houses therein a laser oscillator 28 for emitting a processing pulsed laser beam LB1 having a wavelength transmittable through the SiC ingot 86, an attenuator 30 for adjusting the output power of the processing pulsed laser beam LB1 emitted from the laser oscillator 28, and a mirror 32 for reflecting the processing pulsed laser beam LB1 whose output power has been adjusted by the attenuator 30 and guiding the reflected processing pulsed laser beam LB1 toward the beam condenser 6.

As illustrated in FIG. 1, the beam condenser 6 of the laser beam applying unit 8 is mounted on a lower surface of a distal end of the horizontal arm of the housing 26. The laser beam applying unit 8 also includes focused spot position adjusting means, not illustrated. The focused spot position adjusting means may include, for example, a vertical ball screw coupled to the beam condenser 6 and an electric motor for rotating the vertical ball screw about its central axis. The focused spot position adjusting means adjusts the vertical position of the focused spot of the processing pulsed laser beam LB1 emitted from the laser oscillator 28.

The beam condenser 6 applies the processing pulsed laser beam LB1 to the SiC ingot 86 while positioning the focused spot of the processing pulsed laser beam LB1 within the SiC ingot 86 at a depth corresponding to a thickness of a wafer to be peeled off from the SiC ingot 86. In the SiC ingot 86 held on the holding unit 4, a c-plane is inclined to an end face of the SiC ingot 86 by an off angle that is formed along a direction perpendicular to the X-axis directions that are perpendicular to the Y-axis directions.

As illustrated in FIG. 1, an image capturing unit 34 for capturing an image of the SiC ingot 86 held on the holding unit 4 is mounted on the lower surface of the distal end of the horizontal arm of the housing 26 at a position spaced from the beam condenser 6 in one of the X-axis directions. A display unit 36 for displaying the image captured by the image capturing unit 34 is disposed on the upper surface of the horizontal arm of the housing 26.

The X-axis feed mechanism 10 includes a ball screw 38 extending in the X-axis directions along the upper surface of the base 18 and an electric motor 40 for rotating the ball screw 38 about its central axis. The ball screw 38 is threaded through a nut, not illustrated, coupled to the X-axis movable plate 20. When the electric motor 40 is energized, the ball screw 38 rotates about its central axis, and the nut converts the rotation of the ball screw 38 into linear motion transmitted to the X-axis movable plate 20, which is processing-fed along guide rails 18a on the base 18 in one of the X-axis directions relatively to the beam condenser 6.

The Y-axis feed mechanism 12 includes a ball screw 42 extending in the Y-axis directions along an upper surface of the X-axis movable plate 20 and an electric motor 44 for rotating the ball screw 42 about its central axis. The ball screw 42 is threaded through a nut, not illustrated, coupled to the Y-axis movable plate 22. When the electric motor 44 is energized, the ball screw 42 rotates about its central axis, and the nut converts the rotation of the ball screw 42 into linear motion transmitted to the Y-axis movable plate 22, which is indexing-fed along guide rails 20a on the X-axis movable plate 20 in one of the Y-axis directions relatively to the beam condenser 6.

As illustrated in FIG. 1, the reflected beam detecting unit 14 includes a light emitter 46 and a light detector 48 that are mounted on the lower surface of the distal end of the horizontal arm of the housing 26. The light emitter 46 includes a laser oscillator, not illustrated, for emitting an inspecting pulsed laser beam LB2 (see FIG. 6) having a wavelength transmittable through the SiC ingot 86 and reflectable from the cracks of the peel-off zones in the SiC ingot 86, and a beam irradiator, not illustrated, for applying the inspecting pulsed laser beam LB2 emitted from the laser oscillator to the SiC ingot 86. The light detector 48 may include a photodiode or the like.

Both the light emitter 46 and the light detector 48 are movable in the X-axis directions, the Y-axis directions, and vertical directions, and have their angles variable with respect to the end face of the SiC ingot 86. Consequently, the light emitter 46 can adjust an angle θ (see FIG. 6) of incidence of the inspecting pulsed laser beam LB2 on the end face of the SiC ingot 86, and the light detector 48 can adjust a position of a light detecting surface thereof into the path of the inspecting pulsed laser beam LB2 reflected from the cracks of the peel-off zones in the SiC ingot 86.

The control unit 16 is in the form of a computer including a central processing unit (CPU), not illustrated, for performing arithmetic processing operations according to control programs, a read only memory (ROM), not illustrated, for storing the control programs, etc., and a read/write random access memory (RAM), not illustrated, for storing the results of the arithmetic processing operations.

As illustrated in FIG. 2, the control unit 16 is electrically connected to the light detector 48, so that the light detector 48 can send a signal representing an intensity of the reflected beam detected by the light detector 48 to the control unit 16. The control unit 16 is also electrically connected to the attenuator 30 of the laser beam applying unit 8. The control unit 16 controls the attenuator 30 on the basis of the intensity of the reflected beam sent from the light detector 48 for adjusting the output power of the processing pulsed laser beam LB1 in order to keep the intensity of the reflected beam detected by the light detector 48 within a predetermined range, for example, to keep a voltage signal from the light detector 48 within a range of 1 to 1.2 V.

The predetermined range referred to above is established on the basis of the results of experiments conducted in advance as a range for forming proper peel-off zones in the SiC ingot 86 and allowing a wafer to be properly peeled off from the SiC ingot 86. If the intensity of the reflected beam is smaller than the lower limit of the above predetermined range, then there is a possibility that cracks of peel-off zones may not have grown sufficiently and a wafer may not properly be peeled off from the SiC ingot 86. Consequently, when the intensity of the reflected beam is smaller than the lower limit of the above predetermined range, the control unit 16 controls the attenuator 30 to increase the output power of the processing pulsed laser beam LB1 to keep the intensity of the reflected beam within the predetermined range.

On the other hand, if the intensity of the reflected beam exceeds the upper limit of the above predetermined range, then although a wafer can properly be peeled off from the SiC ingot 86, cracks of peel-off zones have grown excessively. After the wafer has been peeled off from the SiC ingot 86, when their surfaces that have been separated from each other are planarized by grinding, an amount of SiC ground off the SiC ingot 86 and the wafer is unduly large, tending to result in an increase in the volume of wasted SiC ingot. Therefore, when the intensity of the reflected beam exceeds the upper limit of the above predetermined range, the control unit 16 controls the attenuator 30 to reduce the output power of the processing pulsed laser beam LB1 to keep the intensity of the reflected beam within the predetermined range.

As illustrated in FIG. 1, the laser processing apparatus 2 according to the present embodiment further includes a peeling unit 50 for peeling off a wafer from the SiC ingot 86 with the peel-off zones acting as a severance initiating point, and a grinding unit 52 for grinding the end face of the SiC ingot 86 into a flat surface.

The peeling unit 50 includes a casing 54 disposed on the base 18 at terminal ends of the guide rails 18a, an arm 56 having a proximal end vertically movably supported on the casing 54 and extending in one of the X-axis directions from the proximal end, and arm lifting and lowering means, not illustrated, for lifting and lowering the arm 56. The arm lifting and lowering means may include a ball screw coupled to the arm 56 and extending vertically and an electric motor for rotating the ball screw about its central axis. An electric motor 58 is attached to a distal end of the arm 56, and a suction pad 60 is rotatably coupled to a lower surface of the electric motor 58 and connected to the rotational shaft of the electric motor 58 for rotation about a vertical central axis thereof. The suction pad 60 has a plurality of suction holes, not illustrated, defined in a lower surface thereof and is connected to suction means, not illustrated. Ultrasonic vibration imparting means, not illustrated, for imparting ultrasonic vibrations to the lower surface of the suction pad 60 is incorporated in the suction pad 60.

The grinding unit 52 includes a mount wall 62 connected to the housing 26, a vertically movable plate 64 vertically movably mounted on a vertical surface of the mount wall 62, and lifting and lowering means 66 for lifting and lowering the vertically movable plate 64. The lifting and lowering means 66 includes a ball screw 68 vertically extending along the vertical surface of the mount wall 62 and an electric motor 70 for rotating the ball screw 68 about its central axis. The ball screw 68 is threaded through a nut, not illustrated, coupled to the vertically movable plate 64. When the electric motor 70 is energized, the ball screw 68 rotates about its central axis, and the nut converts the rotation of the ball screw 68 into linear motion that is transmitted to the vertically movable plate 64, which is vertically moved along guide rails 62a attached to the vertical surface of the mount wall 62.

Figure 4:
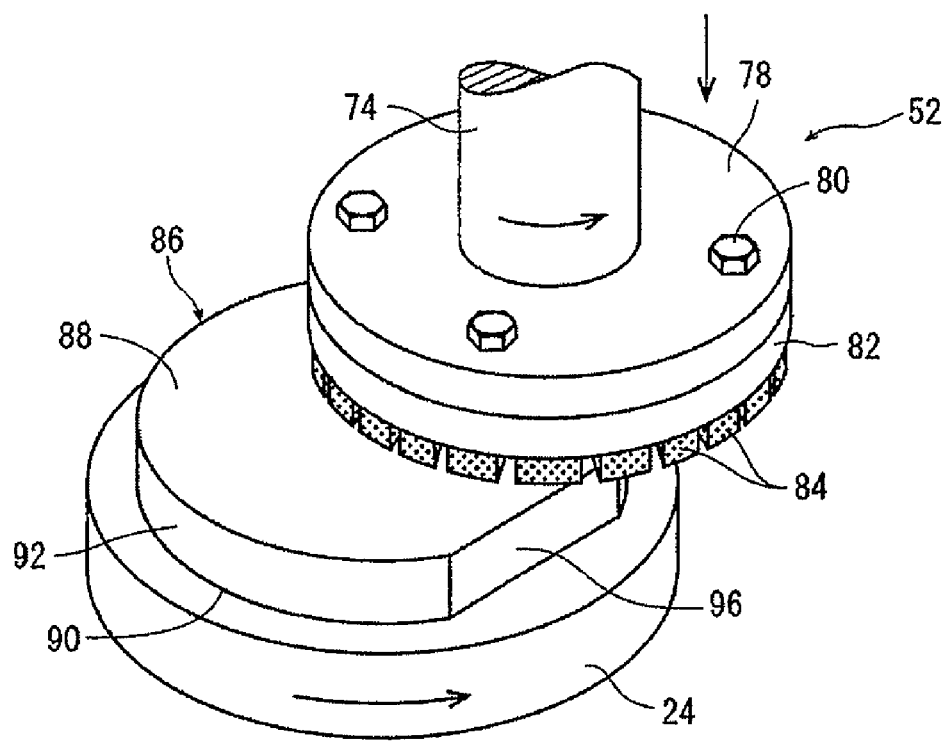
FIG. 4 is a perspective view illustrating a manner in which a flat surface forming step is performed on the SiC ingot.

A support wall 72 projecting in one of the Y-axis directions is fixed to a vertical surface of the vertically movable plate 64. A spindle 74 is rotatably supported on the support wall 72 for rotation about a vertical central axis thereof, and a spindle motor 76 for rotating the spindle 74 about its central axis is mounted on an upper surface of the support wall 72. As illustrated in FIGS. 1 and 4, a disk-shaped wheel mount 78 is fixed to a lower end of the spindle 74, and an annular grinding wheel 82 is fastened to a lower surface of the wheel mount 78 by bolts 80. A plurality of grindstones 84 that are arranged in an annular array at circumferentially spaced intervals are fixed to an outer circumferential edge portion of a lower surface of the grinding wheel 82.

Figure 3A:
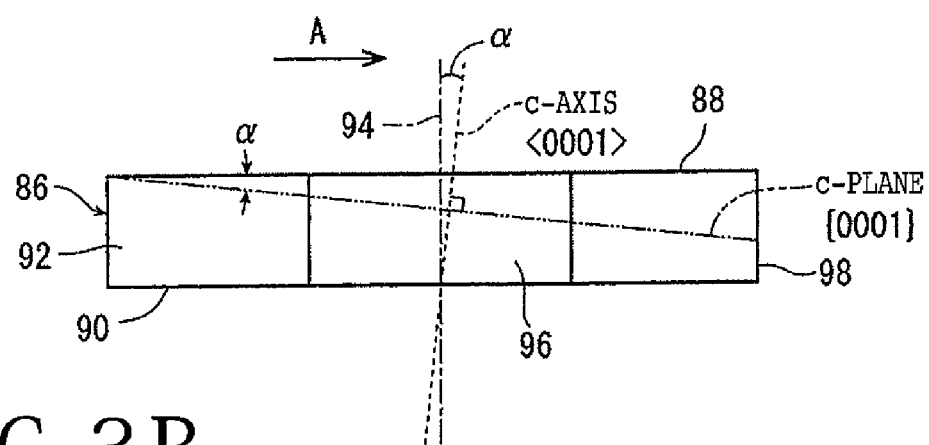
FIG. 3A is a front elevational view of an SiC ingot.
Figure 3B:
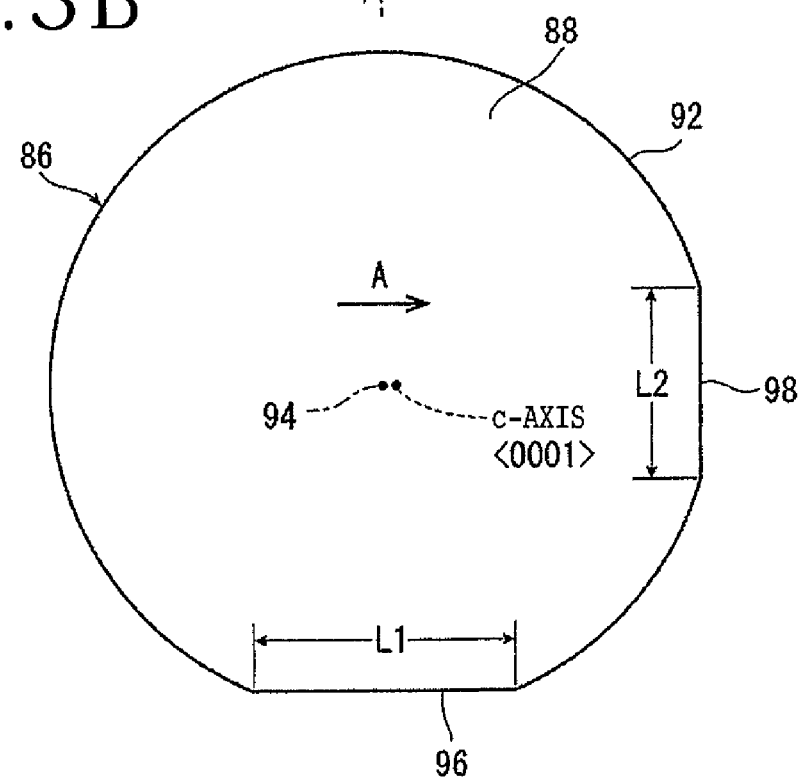
FIG. 3B is a plan view of the SiC ingot.

FIGS. 3A and 3B illustrate the SiC ingot 86 made of SiC and having a cylindrical shape. The SiC ingot 86 has a first end face 88 having a circular shape, a second end face 90 having a circular shape that is opposite the first end face 88, a peripheral surface 92 extending between the first end face 88 and the second end face 90, a c-axis (<0001> direction) extending from the first end face 88 to the second end face 90, and a c-plane ({0001} face) perpendicular to the c-axis. In the SiC ingot 86, the c-plane is inclined to the first end face 88, i.e., the c-axis is inclined to a line 94 normal to the first end face 88, the first end face 88 and the c-plane forming an off angle α (for example, α=1, 3, or 6 degrees) therebetween. The off angle α is formed in the direction indicated by an arrow A in FIGS. 3A and 3B. The peripheral surface 92 of the SiC ingot 86 includes a first orientation flat 96 and a second orientation flat 98, each of a rectangular shape and representing a crystal orientation. The first orientation flat 96 extends parallel to the direction A in which the off angle α is formed, and the second orientation flat 98 extends perpendicularly to the direction A. As illustrated in FIG. 3B, a length L2 of the second orientation flat 98 is smaller than a length L1 of the first orientation flat 96 (L2<L1) as viewed in plan.

The processing method for processing an SiC ingot according to the present embodiment will be described below. The processing method for processing an SiC ingot to be described below is carried out using the laser processing apparatus 2 described above. In the processing method for processing an SiC ingot according to the present embodiment, the SiC ingot 86 with the second end face 90 facing downwardly is fixed to an upper surface of the holding table 24 by a suitable adhesive, for example, an epoxy-resin-based adhesive. Alternatively, the upper surface of the holding table 24 may have a plurality of suction holes defined therein, and the SiC ingot 86 may be held on the holding table 24 by suction forces acting through the suction holes on the upper surface of the holding table 24.

After the SiC ingot 86 has been fixed to the holding table 24, unless the first end face 88 has already been made flat, a flat surface forming step is performed on the SiC ingot 86 by grinding the first end face 88 into a flat surface.

In the flat surface forming step, initially, the holding table 24 is positioned below the grinding wheel 82 of the grinding unit 52 by the X-axis feed mechanism 10. Then, as illustrated in FIG. 4, the holding table motor is energized to rotate the holding table 24 at a predetermined rotational speed of 300 rpm, for example, counterclockwise as viewed from above. The spindle motor 76 is also energized to rotate the spindle 74 at a predetermined rotational speed of 6000 rpm, for example, counterclockwise as viewed from above. Then, the lifting and lowering means 66 lowers the spindle 74 to bring the grindstones 84 into contact with the first end face 88 of the SiC ingot 86. Thereafter, the spindle 74 is lowered at a predetermined grinding feed speed of 0.1 μm/s., for example. The first end face 88 of the SiC ingot 86 is now ground into a flat surface smooth enough not to obstruct the transmission of the processing pulsed laser beam LB1 through the SiC ingot 86.

After the SiC ingot 86 has been held on the upper surface of the holding table 24 and the first end face 88 of the SiC ingot 86 has been ground, a peel-off zone forming step is carried out on the SiC ingot 86 in which the c-plane is inclined to the first end face 88 of the SiC ingot 86 and the directions perpendicular to the direction A in which the off angle α is formed between the first end face 88 of the SiC ingot 86 and the c-plane are represented as the X-axis directions and the directions perpendicular to the X-axis directions are represented as the Y-axis directions. The peel-off zone forming step is performed by applying the processing pulsed laser beam LB1 whose wavelength is transmittable through the SiC ingot 86 to the SiC ingot 86 while positioning a focused spot of the processing pulsed laser beam LB1 at a depth corresponding to a thickness of a wafer to be peeled off from, and processing-feeding the SiC ingot 86 and the focused spot relatively to each other in one of the X-axis directions to form belt-shaped peel-off zones each including cracks extending along the c-plane from the region where SiC is separated into Si and C.

Figure 5A:
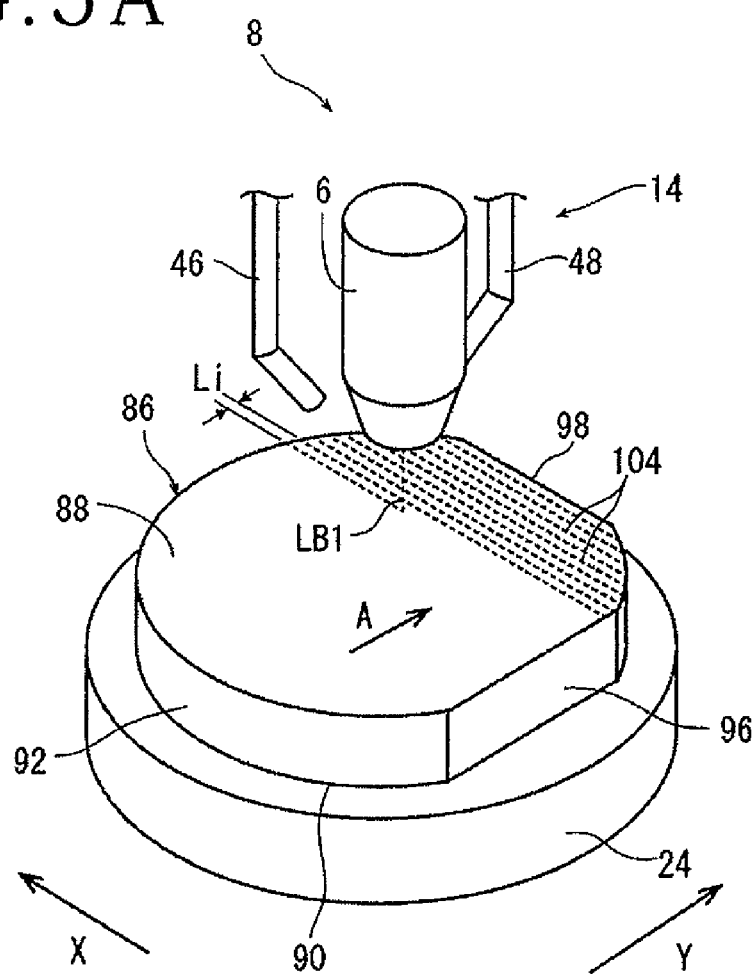
FIG. 5A is a perspective view illustrating a manner in which a peel-off zone forming step is performed on the SiC ingot.

In the peel-off zone forming step, initially, the image capturing unit 34 captures an image of the SiC ingot 86 from above the SiC ingot 86. Then, on the basis of the image of the SiC ingot 86 captured by the image capturing unit 34, the X-axis feed mechanism 10, the Y-axis feed mechanism 12, and the holding table motor are controlled to move and rotate the holding table 24 to adjust the direction of the SiC ingot 86 to a predetermined direction and also to adjust the positions of the SiC ingot 86 and the beam condenser 6 in the XY plane. For adjusting the direction of the SiC ingot 86 to the predetermined direction, as illustrated in FIG. 5A, the second orientation flat 98 is aligned with the X-axis directions to align the directions perpendicular to the direction A in which the off angle α is formed with the X-axis directions, and to align the direction A in which the off angle α is formed with the Y-axis directions.

Figure 5B:
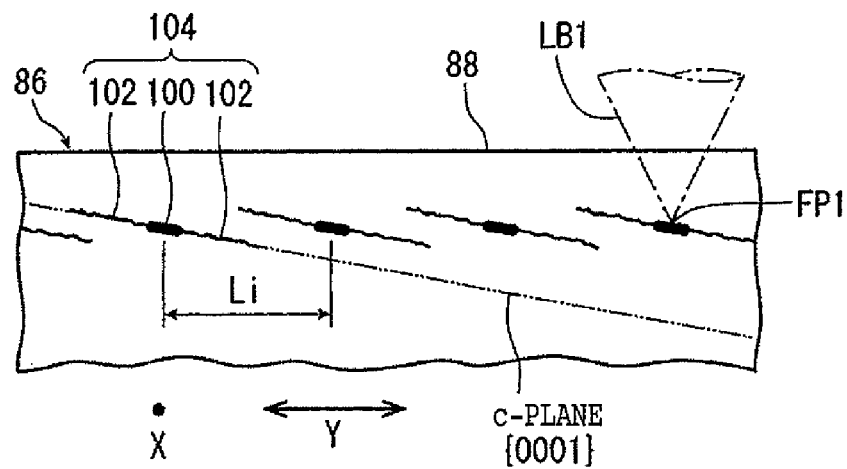
FIG. 5B is an enlarged fragmentary cross-sectional view illustrating the manner in which the peel-off zone forming step is performed on the SiC ingot.

Then, the focused spot position adjusting means lifts and lowers the beam condenser 6 to position a focused spot FP1 (see FIG. 5B) of the processing pulsed laser beam LB1 at a depth corresponding to the thickness of a wafer to be peeled off from the SiC ingot 86, from the first end face 88 of the SiC ingot 86. Then, the X-axis feed mechanism 10 processing-feeds the holding table 24 at a predetermined processing feed speed in one of the X-axis directions aligned with the directions perpendicular to the direction A in which the off angle α is formed, while at the same time the beam condenser 6 applies the processing pulsed laser beam LB1 whose wavelength is transmittable through the SiC ingot 86 to the SiC ingot 86. As illustrated in FIG. 5B, the processing pulsed laser beam LB1 thus applied separates SiC into Si and C, and the processing pulsed laser beam LB1 next applied is absorbed by previously formed C, separating SiC into Si and C in a chain-reaction manner. Peel-off zones 104 each including cracks 102 extending along the c-plane from a region 100 where SiC is separated into Si and C are now formed along the c-plane in the SiC ingot 86.

The peel-off zone forming step is carried out under the conditions described below, for example. Defocus referred to in the conditions represents a distance by which the beam condenser 6 is moved toward an upper surface, i.e., the first end face 88, of the SiC ingot 86 after the focused spot FP1 of the processing pulsed laser beam LB1 has been positioned on the first end face 88 of the SiC ingot 86.

Wavelength of processing pulsed laser beam: 1064 nm
Average output power: 7 to 16 W
Repetitive frequency: 30 kHz
Pulse duration: 3 ns
Processing feed speed: 165 mm/s
Defocus: 188 μm
Position of peel-off zones form upper surface of SiC ingot: 500 μm While the peel-off zone forming step is being carried out, a reflected beam detecting step is carried out for detecting the intensity of a beam reflected by the cracks 102 by applying an inspecting laser beam having a wavelength transmittable through the SiC ingot 86 and reflectable from the cracks 102 of the peel-off zones 104.

Figure 6:
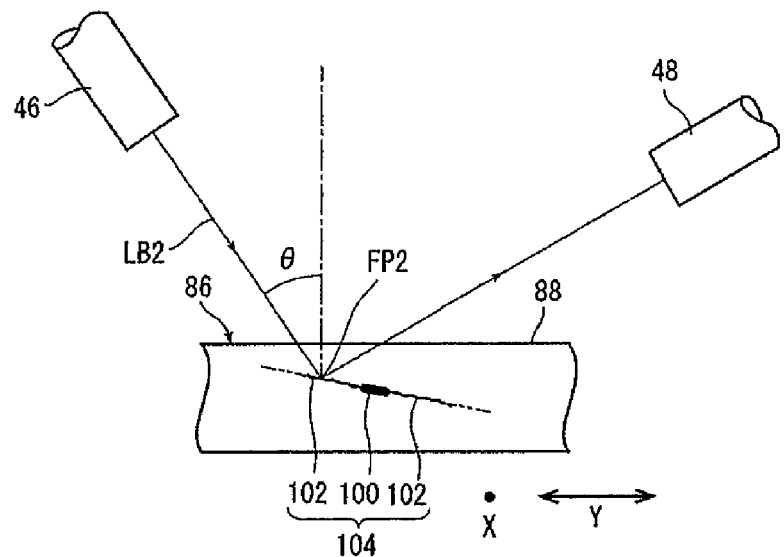
FIG. 6 is an enlarged fragmentary cross-sectional view illustrating a manner in which a reflected beam detecting step is performed on the SiC ingot.

In the reflected beam detecting step, as illustrated in FIG. 6, a focused spot FP2 of the inspecting pulsed laser beam, denoted by LB2, emitted from the light emitter 46 is positioned at the cracks 102 of a peel-off zone 104 formed by the processing pulsed laser beam LB1. For adjusting the position of the light emitter 46, it is preferable to set the angle θ of incidence of the inspecting pulsed laser beam LB2 on the first end face 88 of the SiC ingot 86 to the Brewster angle. Since the proportion of a portion of the inspecting pulsed laser beam LB2 applied to the SiC ingot 86 that is not reflected by the first end face 88, but is introduced into the SiC ingot 86 is thus increased, the level of accuracy with which the beam reflected by the cracks 102 of the peel-off zone 104 in the SiC ingot 86 is detected is increased. In addition, the light detecting surface of the light detector 48 is positioned in the path of the inspecting pulsed laser beam LB2 reflected from the cracks 102 of the peel-off zone 104.

Then, while the holding table 24 is being processing-fed in the X-axis direction, the processing pulsed laser beam LB1 is applied to the SiC ingot 86 to form peel-off zones 104 in the SiC ingot 86, and the inspecting pulsed laser beam LB2 is applied to the cracks 102 of the peel-off zones 104 thus formed. The inspecting pulsed laser beam LB2 reflected by the cracks 102 of the peel-off zones 104 is detected by the light detector 48, which sends a signal representing the intensity of the reflected beam detected by the light detector 48 to the control unit 16.

The reflected light detecting step is carried out under the following conditions, for example.
  Wavelength of inspecting pulsed laser beam: 1064 nm
  Average output power: 0.1 W
  Repetitive frequency: 10 kHz
  Pulse duration: 10 ns
  Feed speed: 165 mm/s Further, while the peel-off zone forming step and the reflected light detecting step are being carried out, a processing laser beam output power adjusting step is carried out for adjusting the output power of the processing pulsed laser beam LB1 to keep the intensity of the reflected beam detected in the reflected light detecting step within a predetermined range. Specifically, while the peel-off zones 104 are being formed in the SiC ingot 86 by the processing pulsed laser beam LB1 applied thereto, the inspecting pulsed laser beam LB2 is applied to the cracks 102 of the formed peel-off zones 104 and the reflected inspecting pulsed laser beam LB2 is detected to adjust the output power of the processing pulsed laser beam LB1.

In the processing laser beam output power adjusting step, the control unit 16 controls the attenuator 30 to adjust the output power of the processing pulsed laser beam LB1 to keep the intensity of the reflected beam detected by the light detector 48 within a predetermined range. If the intensity of the reflected beam detected by the light detector 48 is smaller than the lower limit of the predetermined range, then the control unit 16 controls the attenuator 30 to increase the output power of the processing pulsed laser beam LB1 by approximately 1 to 6 W. On the other hand, if the intensity of the reflected beam detected by the light detector 48 exceeds the upper limit of the predetermined range, then the control unit 16 controls the attenuator 30 to reduce the output power of the processing pulsed laser beam LB1 by approximately 1 to 6 W.

Next, an indexing feed step is carried out for indexing-feeding the SiC ingot 86 and the focused spot FP1 relatively to each other in the Y-axis direction to array the peel-off zones 104 in the Y-axis direction. In the indexing feed step, the Y-axis feed mechanism 12 moves the holding table 24 to indexing-feed the SiC ingot 86 relatively to the focused spot FP1 by a predetermined indexing feed distance Li in the Y-axis direction aligned with the direction A in which the off angle α is formed.

The peel-off zone forming step and the indexing feed step are alternately repeated to array the peel-off zones 104 extending in the X-axis direction at intervals of the predetermined indexing feed distance Li in the Y-axis direction, as illustrated in FIG. 5B. By keeping the indexing feed distance Li in a range not exceeding the width of the cracks 102 and having the cracks 102 of adjacent ones of the peel-off zones 104 in the Y-axis direction vertically overlapping each other, a wafer can easily be peeled off from the SiC ingot 86 in a peeling step to be described below. After the output power of the processing pulsed laser beam LB1 has been adjusted to keep the intensity of the reflected beam within the predetermined range, the reflecting light detecting step and the processing laser beam output power adjusting step may not be carried out at the same depth in the SiC ingot 86.

After a plurality of peel-off zones 104 have been formed within the SiC ingot 86 at the depth corresponding to the thickness of a wafer to be peeled off from the SiC ingot 86, a peeling step is carried out for peeling off a wafer from the SiC ingot 86 with the peel-off zones 104 acting as a severance initiating point.

Figure 7:
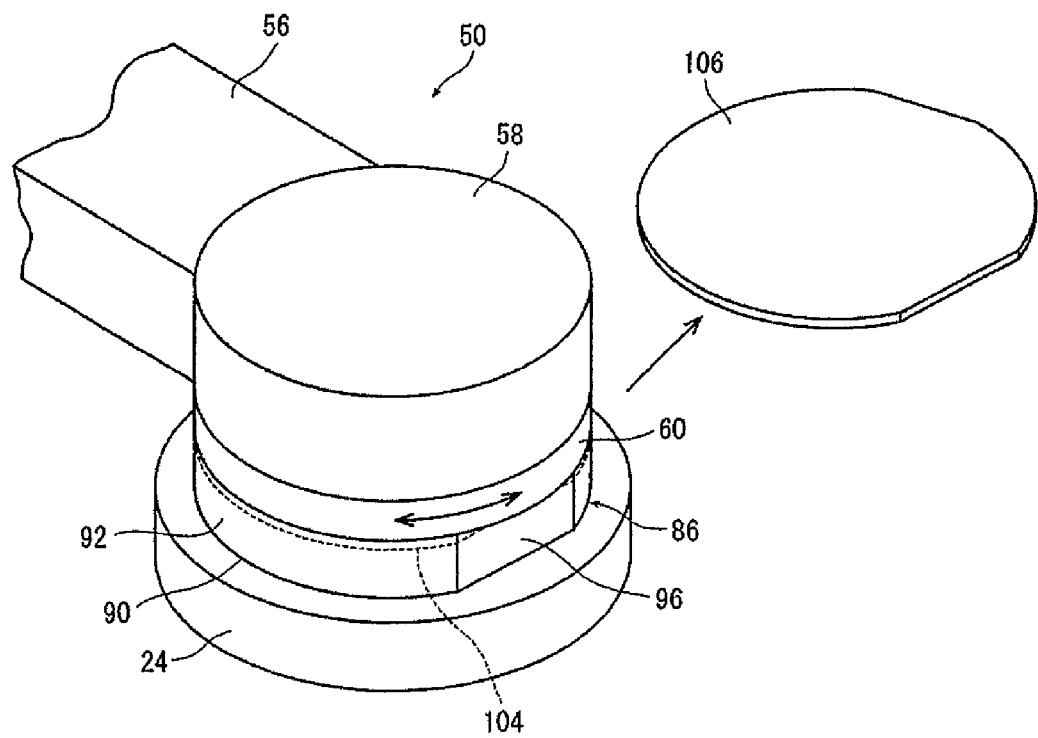
FIG. 7 is a perspective view illustrating a manner in which a peeling step is performed on the SiC ingot.

In the peeling step, the X-axis feed mechanism 10 positions the holding table 24 below the suction pad 60 of the peeling unit 50. Then, the arm lifting and lowering means lowers the arm 56 to bring the lower surface of the suction pad 60 into intimate contact with the first end face 88 of the SiC ingot 86, as illustrated in FIG. 7. Next, the suction means is actuated to attract the first end face 88 of the SiC ingot 86 under suction to the lower surface of the suction pad 60. Then, the ultrasonic vibration imparting means is actuated to apply ultrasonic vibrations to the lower surface of the suction pad 60, and the electric motor 58 is energized to rotate the suction pad 60. A wafer 104 is now peeled off from the SiC ingot 86 with the peel-off zones 104 acting as a severance initiating point.

After the peeling step has been carried out, the flat surface forming step, the peel-off zone forming step, the reflected light detecting step, the processing laser beam output power adjusting step, the indexing feed step, and the peeling step described above are repeated to peel off a plurality of wafers 106 successively from the SiC ingot 86.

According to the present embodiment, as described above, since the intensity of the beam reflected from the cracks 102 of the peel-off zones 104 to which the inspecting pulsed laser beam LB2 is applied is detected and the output power of the processing pulsed laser beam LB1 is adjusted to keep the intensity of the reflected light that is detected within the predetermined range, proper peel-off zones 104 can be formed in the SiC ingot 86 at any heights in the SiC ingot 86.

According to the present embodiment, the peel-off zone forming step, the reflected light detecting step, and the processing laser beam output power adjusting step are illustrated as being performed at the same time. However, these steps may be performed separately. For example, the peel-off zone forming step, then the reflected light detecting step, and then the processing laser beam output power adjusting step may be carried out successively.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing an SiC ingot in which a c-plane is inclined to an end face of the SiC ingot and a direction perpendicular to a direction in which an off angle is formed between the end face of the SiC ingot and the c-plane is represented as X-axis direction and a direction perpendicular to the X-axis direction is represented as Y-axis directions, comprising:
   a peel-off zone forming step of applying a processing pulsed laser beam whose wavelength is transmittable through the SiC ingot to the SiC ingot while positioning a focused spot of the processing pulsed laser beam at a depth corresponding to a thickness of a wafer to be peeled off from the SiC ingot, and processing-feeding the SiC ingot and the focused spot relatively to each other in the X-axis direction to form belt-shaped peel-off zones in the SiC ingot each including cracks extending along the c-plane from a region where SiC is separated into Si and C;
   an indexing feed step of indexing-feeding the SiC ingot and the focused spot relatively to each other in the Y-axis direction to array the peel-off zones in the Y-axis direction;
   a reflected beam detecting step of applying an inspecting laser beam having a wavelength transmittable through the SiC ingot and reflectable from the cracks of the peel-off zones and detecting an intensity of a beam reflected by the cracks; and
   a processing laser beam output power adjusting step of adjusting an output power of the processing pulsed laser beam to keep the intensity of the reflected beam detected in the reflected beam detecting step within a predetermined range.

2. The method of processing an SiC ingot according to claim 1, further comprising:
   before the peel-off zone forming step, a flat surface forming step of grinding the end face of the SiC ingot into a flat surface.

3. A laser processing apparatus for forming peel-off zones in an SiC ingot in which a c-plane is inclined to an end face of the SiC ingot and a direction perpendicular to a direction in which an off angle is formed between the end face of the SiC ingot and the c-plane is represented as X-axis directions and a direction perpendicular to the X-axis direction is represented as Y-axis directions, comprising:
   a holding table for holding the SiC ingot thereon;
   a laser beam applying unit including a beam condenser for applying a processing pulsed laser beam whose wavelength is transmittable through the SiC ingot, held on the holding table, to the SiC ingot while positioning a focused spot of the processing pulsed laser beam at a depth corresponding to a thickness of a wafer to be peeled off from the SiC ingot, to form belt-shaped peel-off zones in the SiC ingot each including cracks extending along the c-plane from a region where SiC is separated into Si and C;
   an X-axis feed mechanism for processing-feeding the holding table and the beam condenser relatively to each other in the X-axis direction;
   a Y-axis feed mechanism for indexing-feeding the holding table and the beam condenser relatively to each other in the Y-axis direction;
   a reflected beam detecting unit for applying an inspecting laser beam having a wavelength transmittable through the SiC ingot and reflectable from the cracks of the peel-off zones and detecting an intensity of a beam reflected by the cracks; and
   a control unit for adjusting an output power of the processing pulsed laser beam to keep the intensity of the reflected beam detected by the reflected beam detecting unit within a predetermined range.

* * * * *